(12) United States Patent
Chung et al.

(10) Patent No.: US 9,784,896 B2
(45) Date of Patent: Oct. 10, 2017

(54) PATTERN STRUCTURE AND METHOD OF MANUFACTURING THE PATTERN STRUCTURE

(71) Applicant: Samsung Electronics Co., Ltd., Suwon-si, Gyeonggi-do (KR)

(72) Inventors: Jaeseung Chung, Suwon-si (KR); Dongouk Kim, Pyeongtaek-si (KR); Joonyong Park, Suwon-si (KR); Jihyun Bae, Seoul (KR); Bongsu Shin, Seoul (KR); Sunghoon Lee, Seoul (KR); Sukgyu Hahm, Gyeongju-si (KR); Jong G. Ok, Seoul (KR); Ilsun Yoon, Seongnam-si (KR)

(73) Assignee: SAMSUNG ELECTRONICS CO., LTD., Gyeonggi-do (KR)

( * ) Notice: Subject to any disclaimer, the term of this patent is extended or adjusted under 35 U.S.C. 154(b) by 35 days.

(21) Appl. No.: 14/733,234

(22) Filed: Jun. 8, 2015

(65) Prior Publication Data
US 2016/0054498 A1 Feb. 25, 2016

(30) Foreign Application Priority Data
Aug. 25, 2014 (KR) .................. 10-2014-0111039

(51) Int. Cl.
*G02B 5/30* (2006.01)
*G03F 7/00* (2006.01)
(Continued)

(52) U.S. Cl.
CPC ...... *G02B 5/3058* (2013.01); *B29D 11/00644* (2013.01); *G03F 7/0002* (2013.01); *B29K 2101/10* (2013.01)

(58) Field of Classification Search
CPC ........ Y10T 428/24479; Y10T 428/2457; G03F 7/0002; G02B 5/3058; G02B 5/3066;
(Continued)

(56) References Cited

U.S. PATENT DOCUMENTS

2006/0021533 A1 2/2006 Jeans
2006/0063359 A1* 3/2006 Stacey ............ H01L 21/02126
438/494
(Continued)

FOREIGN PATENT DOCUMENTS

EP 1655777 A1 5/2006
EP 1801649 A2 6/2007
(Continued)

OTHER PUBLICATIONS

Extended European Search Report for Application No. 15182217.8-1568 dated Jun. 21, 2016.

*Primary Examiner* — Catherine A Simone
(74) *Attorney, Agent, or Firm* — Cantor Colburn LLP

(57) ABSTRACT

A pattern structure includes a plurality of pattern structure units arranged substantially on a same plane, where each of the pattern structure units has a first surface and a second surface, which are opposite to each other, and a microstructure is defined on the first surface of each of the pattern structure units, and a flattening layer disposed on the second surface of each of the plurality of pattern structure units, where the flattening layer connects the pattern structure units with each other, and a vertical step difference exists between second surfaces of the pattern structure units.

8 Claims, 18 Drawing Sheets

(51) Int. Cl.
  *B29D 11/00* (2006.01)
  *B29K 101/10* (2006.01)

(58) Field of Classification Search
  CPC ..... B29C 59/02; B29C 59/022; B29C 59/023;
            B82Y 10/00; B82Y 40/00; G02F 1/3336;
            G02F 2001/133548; G02F 1/133528
  USPC .................................................. 359/485.05
  See application file for complete search history.

(56) References Cited

U.S. PATENT DOCUMENTS

| | | |
|---|---|---|
| 2009/0243126 A1 | 10/2009 | Washiya et al. |
| 2012/0049417 A1 | 3/2012 | Inanami |
| 2013/0241107 A1 | 9/2013 | Ermochkine et al. |
| 2014/0093692 A1 | 4/2014 | Miyazawa et al. |
| 2016/0033818 A1 | 2/2016 | Lee et al. |

FOREIGN PATENT DOCUMENTS

| | | |
|---|---|---|
| EP | 1801649 A3 | 7/2009 |
| KR | 100884811 B1 | 2/2009 |
| KR | 1020090087217 A | 8/2009 |
| KR | 1020100011776 A | 2/2010 |

\* cited by examiner

PATTERN STRUCTURE AND METHOD OF MANUFACTURING THE PATTERN STRUCTURE

RELATED APPLICATIONS

This application claims priority to Korean Patent Application No. 10-2014-0111039, filed on Aug. 25, 2014, and all the benefits accruing therefrom under 35 U.S.C. §119, the content of which in its entirety is herein incorporated by reference.

BACKGROUND

1. Field

The disclosure relates to a pattern structure, and more particularly to a pattern structure and a method of manufacturing the pattern structure.

2. Description of the Related Art

A nano- or micro-sized pattern may be formed at low costs and via a simple process using an imprint technology. Thus, extensive research has been performed in this regard. In general, a master, on which a pattern of a predetermined size is formed, a stamp and imprint resin for transferring the pattern are used to perform an imprint process. Recently, as demands for transferring a pattern of a uniform and large size have increased, efforts to realize a large-size imprint process have been undertaken. A technology to manufacture a defect-free master or stamp may be used to transfer a uniform and large-sized pattern.

A thin film transistor-liquid crystal display ("TFT-LCD") typically includes a polarizer. For example, a polyvinyl alcohol ("PVA") polarizer that is an absorptive polarizer has been widely used as the polarizer. The PVA polarizer is disposed on each of an upper glass and a lower glass of a display panel in the TFT-LCD and transmits or blocks incoming light from a back light unit ("BLU"), thereby performing a core role in driving the display panel. Recently, a metal wire grid polarizer ("WGP") that is a reflective polarizer characteristically reflects S-polarized waves and transmits P-polarized waves is also used as the polarizer, instead of the absorptive polarizer that absorbs S-polarized waves and transmits P-polarized waves. Accordingly, when such a metal WGP is applied to a TFT-LCD, the S-polarized waves reflected from a surface of the metal WGP are recycled, thereby improving brightness of the TFT-LCD and reducing the costs for a light source. Recently, as the size of a display panel has been gradually increased, the size of metal WGP has been increased.

SUMMARY

Exemplary embodiments relate to a pattern structure and a manufacturing method thereof.

According to an exemplary embodiment of the invention, a pattern structure includes a plurality of pattern structure units arranged substantially on a same plane, where each of the pattern structure units has a first surface and a second surface, which are opposite to each other, and a microstructure is defined on the first surface of each of the pattern structure units, and a flattening layer disposed on the second surface of each of the pattern structure units, where the flattening layer connects the pattern structure units with each other, and a vertical step difference exists between second surfaces of the pattern structure units.

In an exemplary embodiment, microstructures of the plurality of pattern structure units are located substantially at a same height.

In an exemplary embodiment, the pattern structure may further include a substrate disposed on the flattening layer.

In an exemplary embodiment, a surface of the flattening layer contacting the substrate may be substantially flat.

In an exemplary embodiment, the flattening layer may include a thermosetting resin or a photocurable resin.

In an exemplary embodiment, each of the microstructures of the plurality of pattern structure units may have a width of less than about 1 micrometer ($\mu$m).

In an exemplary embodiment, the microstructures may be arranged with a predetermined repeating pattern and substantially parallel to each other.

In an exemplary embodiment, the plurality of pattern structure units may be arranged substantially in a matrix form.

In an exemplary embodiment, the pattern structure may be configured to function as a master for manufacturing a stamp or a stamp for imprint.

According to another exemplary embodiment of the invention, a method of manufacturing a pattern structure includes preparing a plurality of pattern structure units, where each of the pattern structure units has a first surface and a second surface, which are opposite to each other, and a microstructure is defined on the first surface of each of the pattern structure, and arranging the plurality of pattern structure units substantially close to each other such that microstructures on the first surfaces of the patter structure units are located substantially at a same height, and providing a flattening layer on the second surface of each of the plurality of pattern structure units.

In an exemplary embodiment, the arranging the plurality of pattern structure units substantially close to each other may include arranging the plurality of pattern structure units on the first substrate such that the microstructure faces the first substrate, which is substantially flat.

In an exemplary embodiment, a vertical step difference may exist between the second surfaces of the plurality of pattern structure units.

In an exemplary embodiment, the method may further include coating a flattening resin on the first substrate, and filling the flattening resin between the microstructures by pressing the plurality of pattern structure units to closely contact the flattening resin.

In an exemplary embodiment, the flattening resin may include a thermosetting resin or a photocurable resin.

In an exemplary embodiment, the method may further include curing the flattening resin.

In an exemplary embodiment, the method may further include removing the flattening resin, which is cured.

In an exemplary embodiment, the method may further include providing a second substrate on the flattening layer.

In an exemplary embodiment, the providing the flattening layer may include coating a flattening resin on the second surfaces of each of the plurality of pattern structure units, and pressing the second substrate toward the flattening resin to allow the flattening resin to closely contact the plurality of pattern structure units.

In an exemplary embodiment, the flattening resin may include a thermosetting resin or a photocurable resin.

In an exemplary embodiment, the method may further include curing the flattening layer such that the flattening layer connects the plurality of pattern structure units to each other.

BRIEF DESCRIPTION OF THE DRAWINGS

These and/or other features of the invention will become apparent and more readily appreciated from the following detailed description of exemplary embodiments thereof, taken in conjunction with the accompanying drawings, in which.

DETAILED DESCRIPTION

Figure 1:
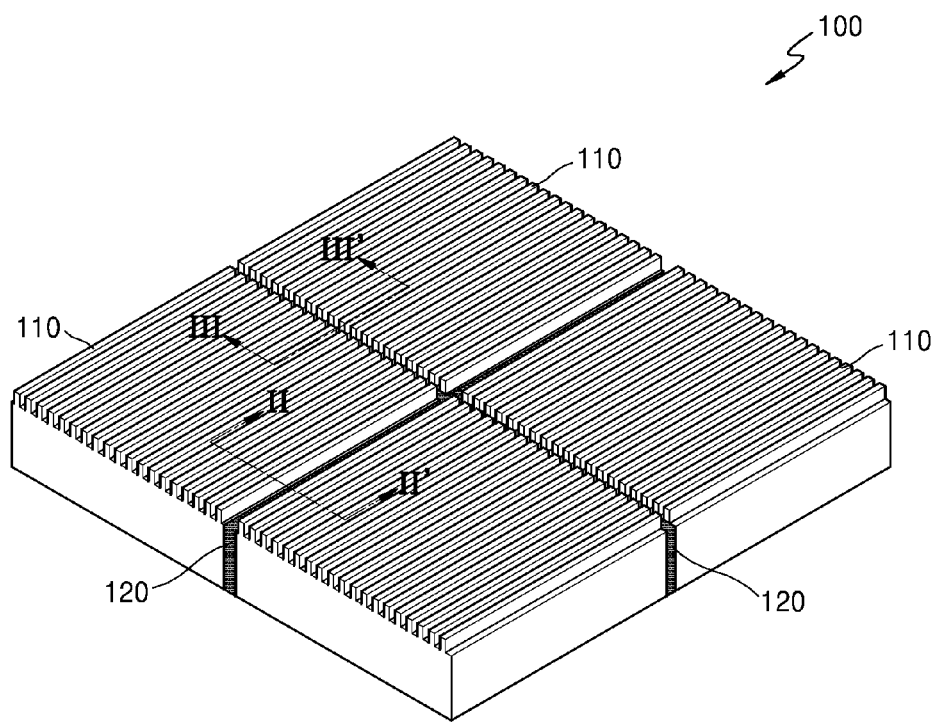
FIG. 1 is a perspective view illustrating an exemplary embodiment of a pattern structure according to the invention.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element is referred to as being "on" another element, it can be directly on the other element or intervening elements may be present therebetween. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, exemplary embodiments will be described in detail with reference to the accompanying drawings.

Figure 2:
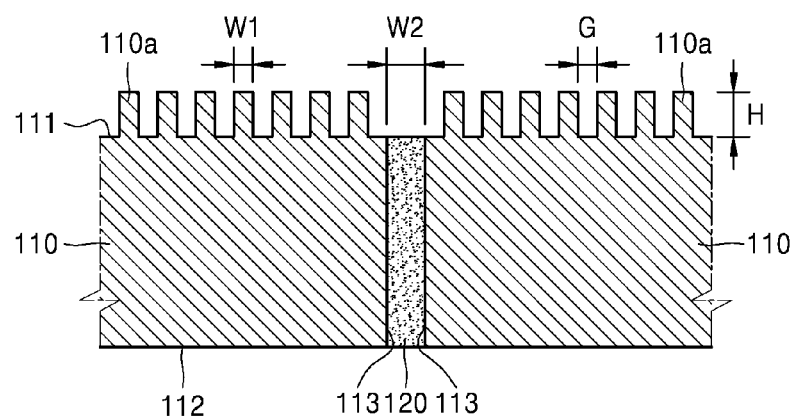
FIG. 2 is a cross-sectional view taken along line II-II' of FIG. 1.
Figure 3:
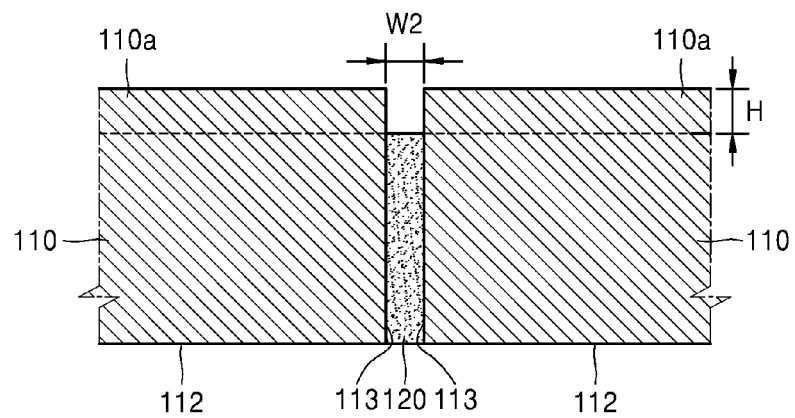
FIG. 3 is a cross-sectional view taken along line III-III' of FIG. 1.

FIG. 1 is a perspective view illustrating an exemplary embodiment of a pattern structure 100 according to the invention. FIG. 2 is a cross-sectional view taken along line II-II' of FIG. 1. FIG. 3 is a cross-sectional view taken along line III-III' of FIG. 1.

Referring to FIGS. 1 to 3, in an exemplary embodiment, the pattern structure 100 may include a plurality of pattern structure units 110 arranged on a same plane and a connection layer 120 provided between the pattern structure units 110. In such an embodiment, a surface (e.g., a lower surface) of each of the pattern structure units 110 may be arranged in the same surface. In an exemplary embodiment, the pattern structure units 110 may include, for example, silicon (Si) or glass, but such an embodiment is not limited thereto.

In an exemplary embodiment, the pattern structure units 110 each include microstructures 110a that protrude from a first surface 111, e.g., an upper surface shown in FIG. 1. A second surface, e.g., a lower surface shown in FIG. 1, which is an opposite surface to the first surface 111, may have a flat shape. A width W1 of each of the microstructures 110a may be less than about 1 micrometer (μm). In one exemplary embodiment, for example, the micro structures 110a each having the width W1 of less than about 1 μm may be arranged with a predetermined repeating pattern and substantially parallel to each other on the first surface 111 of each of the pattern structure units 110. In such an embodiment, a pitch or a gap G between the micro structures 110a may be less than about 1 μm and a height H of each of the micro structures 110a may be less than about 1 μm. Herein, the height H of the micro structures 110a is defined as a distance of a top surface thereof from the first surface 111. However, in exemplary embodiments of the invention, shapes and arrangement of the micro structures 110a are not limited thereto. In exemplary embodiment, the micro structures 110a may be formed in various shapes or arrangements, different from the above-described shape or arrangement.

The pattern structure unit 110 may be manufactured, for example, by patterning a wafer formed of silicon or glass through an etching in a semiconductor process. As such, the microstructures 110a each having the width W1 of less than about 1 μm may be formed by a patterning in the semiconductor process.

The pattern structure units 110 are arranged on substantially the same plane to be close to one another. In an exemplary embodiment, the pattern structure units 110 may be arranged substantially in a matrix form. FIG. 1 illustrates one exemplary embodiment in which the pattern structure units 110 are arranged, for example, in two dimensions, but such an embodiment is not limited thereto. In an alternative exemplary embodiment, the pattern structure units 110 may be arranged in one dimension. The connection layer 120 is provided between the pattern structure units 110. The connection layer 120 combines the pattern structure units 110 to connect the pattern structure units 110. A width W2 of the connection layer 120 may be less than about 10 μm.

In an exemplary embodiment, the connection layer 120 may include a thermosetting resin or a photocurable resin. In such an embodiment, the thermosetting resin or photocurable resin may include, for example, an acrylate-based material, but such an embodiment is not limited thereto. In an alternative exemplary embodiment, the connection layer 120 may include a thermo-shrinking resin or a photo-shrinking resin. In such an embodiment, the thermo-shrinking resin or photo-shrinking resin may include, for example, a polyurethane-based material, but not being limited thereto.

In an exemplary embodiment, bonding surfaces 113 of the pattern structure units 110 combined by the connection layer 120 may have a predetermined surface roughness. The bonding surfaces 113 of the pattern structure units 110 are formed by cutting a pattern wafer (not shown) where the microstructures 110a are formed, as described below. Accordingly, the bonding surfaces 113 of the pattern structure units 110 that are formed by cutting a pattern wafer may have a predetermined surface roughness. In one exemplary embodiment, for example, the bonding surfaces 113 of the pattern structure units 110 each may have a maximum roughness Rmax that is less than about 10 μm. The maximum roughness Rmax is a value indicating a degree of surface roughness defined based on a distance between the lowest position and the highest position on a surface.

In such an embodiment, when the bonding surfaces 113 of the pattern structure units 110 having a predetermined surface roughness are arranged substantially close to one another, an empty space may be defined between the bonding surfaces 113 of the pattern structure units 110. As described below, as the empty space is filled with a predetermined resin, the connection layer 120 is formed. In such an embodiment, the bonding surfaces 113 of the pattern structure units 110 may have substantially the same surface roughness as each other, or the bonding surfaces 113 may have different surface roughnesses from each other. In one exemplary embodiment, for example, the maximum interval between the bonding surfaces 113 of the pattern structure units 110 may be less than about 10 μm. Accordingly, in such an embodiment, the connection layer 120 provided between the pattern structure units 110 may have a width of less than about 10 μm.

Figure 4A:
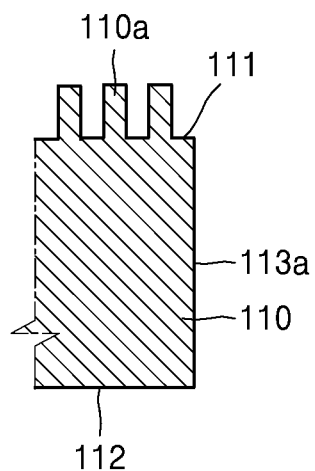
FIGS. 4A to 4D illustrate shapes of exemplary embodiments of a bonding surface of a pattern structure unit, in the pattern structure of FIG. 1.
Figure 4B:
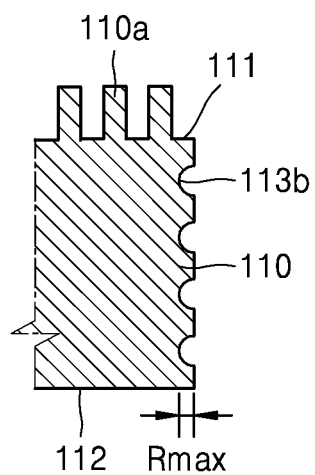
Figure 4C:
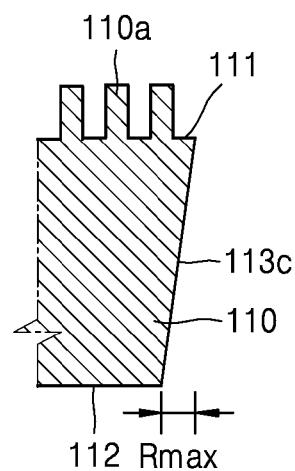
Figure 4D:
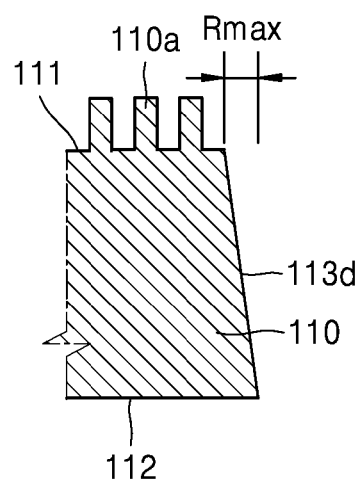

FIGS. 4A to 4D exemplarily illustrate shapes of exemplary embodiments of a bonding surface of the pattern structure unit 110 in the pattern structure 100 of FIG. 1. In an exemplary embodiment, as shown in FIG. 4A, a bonding surface 113a is substantially perpendicular to the first surface 111 or the second surface 112 of the pattern structure unit 110 and to be substantially flat such that the maximum roughness Rmax thereof may be about zero (0). In an alternative exemplary embodiment, as shown in FIG. 4B, a bonding surface 113b is substantially perpendicular to the first surface 111 or the second surface 112 of the pattern structure unit 110 and to have a wavy shape. In such an embodiment, the maximum roughness Rmax of the bonding surface 113b may be less than about 10 μm. In other alternative exemplary embodiments, as shown in FIGS. 4C and 4D, a bonding surface 113c and a bonding surface 113d are inclined with respect to the first surface 111 or the second surface 112 of the pattern structure unit 110. In such an embodiment, the maximum roughness Rmax of the bonding surfaces 113c and 113d may be less than about 10 μm. The shapes of the bonding surface is not limited to the shapes of exemplary embodiment of the bonding surfaces 113a, 113b, 113c and 113d described and may be modified to have various shapes.

As such, the pattern structure units 110, on each of which the microstructures 110*a* having the width W1 of less than about 1 μm are formed, are combined with one another via the connection layer 120 and thus the pattern structure 100 having a large size may be effectively manufactured. In such an embodiment, where the connection layer 120 is have a width of less than about 10 μm, a sense of disconnection may be effectively prevented from occurring or substantially reduced in a seam portion.

Recently, as the size of a liquid crystal display ("LCD") panel gradually increases, a metal WGP applied to the LCD panel is manufactured to be in a large size without defects. To manufacture a metal WGP for a large size LCD panel, a large size master for manufacturing a metal WGP is used. Conventionally, a master having a large diagonal size equal to or more than about 12 inches without defects may not be effectively manufactured. In an exemplary embodiment, where the pattern structure 100 is used as the master, a metal WGP having uniform physical properties across the entire area without defects may be embodied in a large size.

Figure 5:
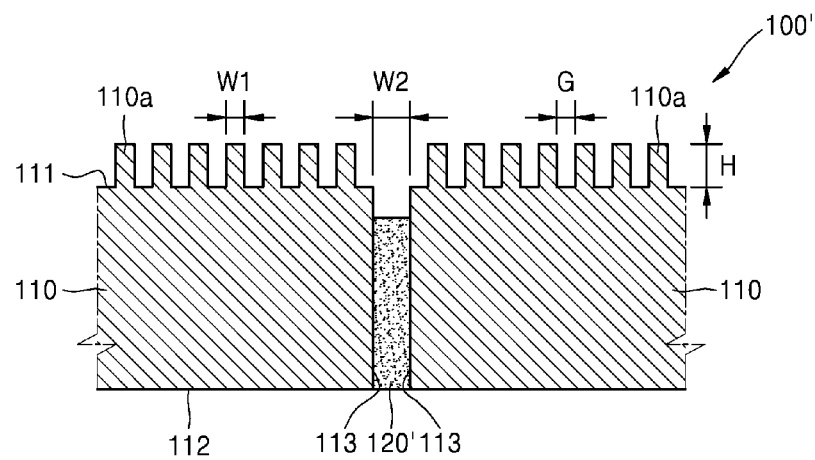
FIG. 5 is a cross-sectional view illustrating an alternative exemplary embodiment of a pattern structure according to the invention.

FIG. 5 is a cross-sectional view illustrating an exemplary embodiment a pattern structure 100' according to the invention. The cross-sectional view in FIG. 5 is substantially the same as the cross-sectional view shown in FIG. 3 except for the connection layer 120, and any repetitive detailed description thereof will hereinafter be omitted or simplified.

Referring to FIG. 5, in an exemplary embodiment, the pattern structure 100' may include a plurality of pattern structure units 110 arranged on the same plane and a connection layer 120' provided between the pattern structure units 110 and combining the pattern structure units 110. The pattern structure units 110 each include the microstructures 110*a* that protrude from the first surface 111. The micro structures 110*a* each have a width of less than about 1 μm, and the connection layer 120 may have a width of less than about 10 μm. In such an embodiment, the bonding surfaces 113 of the pattern structure units 110 each may have the maximum roughness Rmax that is less than about 10 μm.

In an exemplary embodiment shown in FIG. 2, the connection layer 120 may fill the entire space between the bonding surfaces 113 of the pattern structure units 110. Accordingly, in such an embodiment shown in FIG. 2, the first surface 111 of the pattern structure unit 110 and the upper surface of the connection layer 120 may be substantially at the same height. In an alternative exemplary embodiment, as shown in FIG. 5, the connection layer 120' may fill only a part of the space between the bonding surfaces 113 of the pattern structure units 110. In such an embodiment, as illustrated in FIG. 5, an upper surface of the connection layer 120' may be lower than the first surface 111, that is, the upper surface, of the pattern structure unit 110. In an exemplary embodiment, as shown in FIG. 5, the connection layer 120 may be in a lower portion of the space between the pattern structure units 110, but such an embodiment is not limited thereto. In an alternative exemplary embodiment, the connection layer 120' may be disposed in another part, for example, an upper portion or a middle portion, of the space between the pattern structure units 110.

Figure 6:
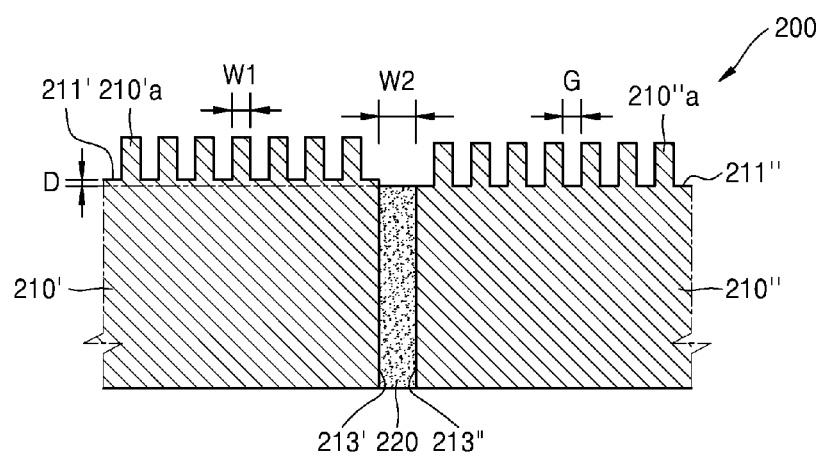
FIG. 6 is a cross-sectional view illustrating another alternative exemplary embodiment of a pattern structure according to the invention.

FIG. 6 is a cross-sectional view illustrating another exemplary embodiment of a pattern structure 200 according to the invention. The cross-sectional view in FIG. 5 is substantially the same as the cross-sectional view shown in FIG. 3 except for a vertical step difference between the pattern structure units 210 and 210', and any repetitive detailed description thereof will hereinafter be omitted or simplified.

Referring to FIG. 6, in an exemplary embodiment, the pattern structure 200 may include a plurality of pattern structure units 210' and 210" arranged substantially on the same plane and a connection layer 220 between the pattern structure units 210' and 210" and combining the pattern structure units 210' and 210". The pattern structure units 210' and 210" each include microstructures 210'*a* and 210"*a* that protrude from first surfaces 211' and 211". The micro structures 211' and 211" each have a width of less than about 1 μm, and the connection layer 220 may have a width of less than about 10 μm. In such an embodiment, the bonding surfaces 213' and 213" of the pattern structure units 210' and 210" each may have the maximum roughness Rmax that is less than about 10 μm.

In an exemplary embodiment, as shown in FIG. 2, no vertical step difference exists between the pattern structure units 110 arranged on the same plane. In an alternative exemplary embodiment, as illustrated in FIG. 6, a predetermined vertical step difference may exist between the pattern structure units 210' and 210" arranged on the same plane, that is, arranged to allow lower surfaces thereof to be disposed in the same plane. The vertical step difference may be generated due to a process error in a process of forming the microstructures 210'*a* and 210"*a* through the etching during a semiconductor process.

In such an embodiment, a vertical step difference D between the first surfaces 211' and 211" of the pattern structure units 210' and 210" combined by the connection layer 220 may be less than, for example, about 10% of a width of each of the microstructures 210'*a* and 210"*a*. In such an embodiment, the vertical step difference D may be less than about 0.1 μm, for example. In such an embodiment, where the vertical step difference D between the pattern structure units 210' and 210" is less than about 10% of the width of each of the microstructures 210'*a* and 210"*a*, the pattern structure 200 having a large size and defect may be substantially reduced or effectively prevented.

FIGS. 7 to 13 are views for describing an exemplary embodiment of a method of manufacturing a pattern structure according to the invention.

Figure 7:
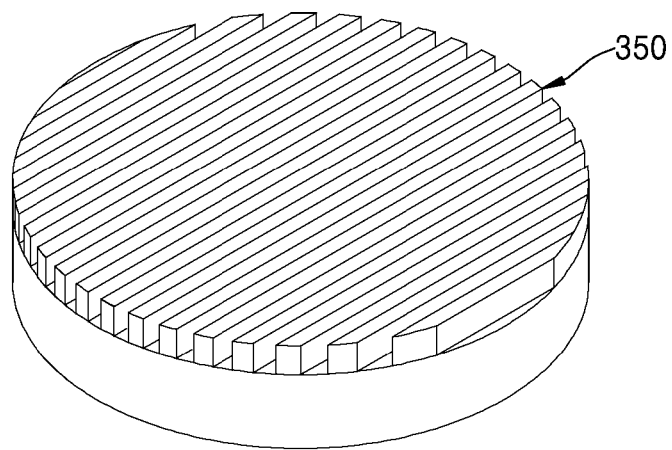
FIGS. 7 to 13 are views for describing an exemplary embodiment of a method of manufacturing a pattern structure, according to the invention.

Referring to FIG. 7, a plurality of pattern wafers 350, on an upper surface of each of which the microstructures 110*a* of FIG. 2 are formed, may be prepared. The pattern wafer 350, for example, may be manufactured by patterning a wafer (not shown) formed of silicon or glass through the etching in a semiconductor process. A plurality of microstructures each having a width of less than about 1 μm may be formed by the patterning through the semiconductor process.

In an exemplary embodiment, the microstructures may be arranged with a predetermined repeating pattern and substantially parallel to each other on the pattern wafer 350 with a width of less than about 1 μm. In such an embodiment, an interval between the microstructures may be less than about 1 μm and a height of each of the microstructures may be less than about 1 μm, but such an embodiment is not limited thereto. In an alternative exemplary embodiment, the shape of the microstructures may be variously modified.

Figure 8:
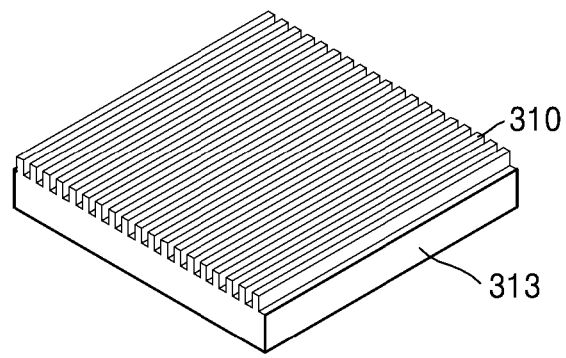

Referring to FIG. 8, a plurality of pattern structure units 310 may be manufactured by cutting the pattern wafers 350 in a predetermined shape. In one exemplary embodiment, as shown in FIG. 8, the pattern wafer 350 may be cut in a rectangular shape, but such an embodiment is not limited thereto. In such an embodiment, the cutting of the pattern wafer 350 may be performed by, for example, an etching process, a laser processing process, or a polishing process. The laser processing process may include laser cutting or laser dicing, but such an embodiment is not limited thereto.

In an exemplary embodiment, where the pattern structure units 310 is manufactured by cutting the pattern wafers 350, cut surfaces 313 of the pattern structure units 310 may have a predetermined surface roughness. The cut surfaces 313 of the pattern structure units 310 define bonding surfaces to be combined by a connection layer 320 of FIG. 13, as described below. The cut surface 313 of the pattern structure unit 310 may have the maximum roughness Rmax that is less than about 10 μm. As described above, the maximum roughness Rmax is a value indicating a degree of surface roughness based on a distance between the lowest position and the highest position on a surface. In such an embodiment, the cut surfaces 313 of the pattern structure units 310 may have the same surface roughness as each other, or may have different surface roughnesses from each other.

Figure 9:
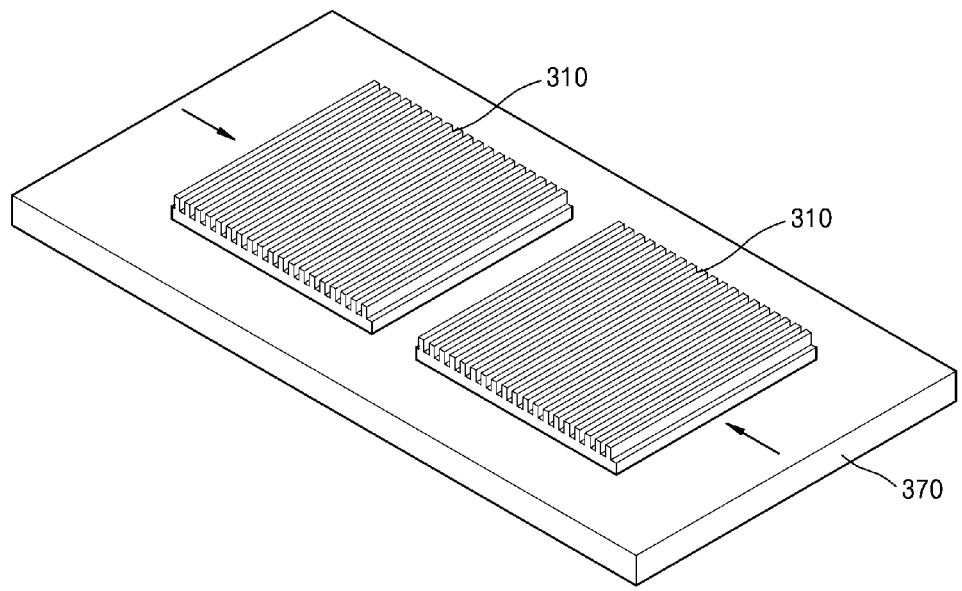

Referring to FIG. 9, the pattern structure units 310 may be arranged on a substrate 370, e.g., on a flat surface of the substrate 370. The pattern structure units 310 may be disposed on the substrate such that a lower surface of each of the pattern structure units 310 contacts the substrate 370. In such an embodiment, a vertical step difference may exist or may not exist between the pattern structure units 310 that are arranged on the substrate 370. In such an embodiment, the vertical step difference between the pattern structure units 310 may be less than about 10% of the width of each of the microstructures.

Figure 10:
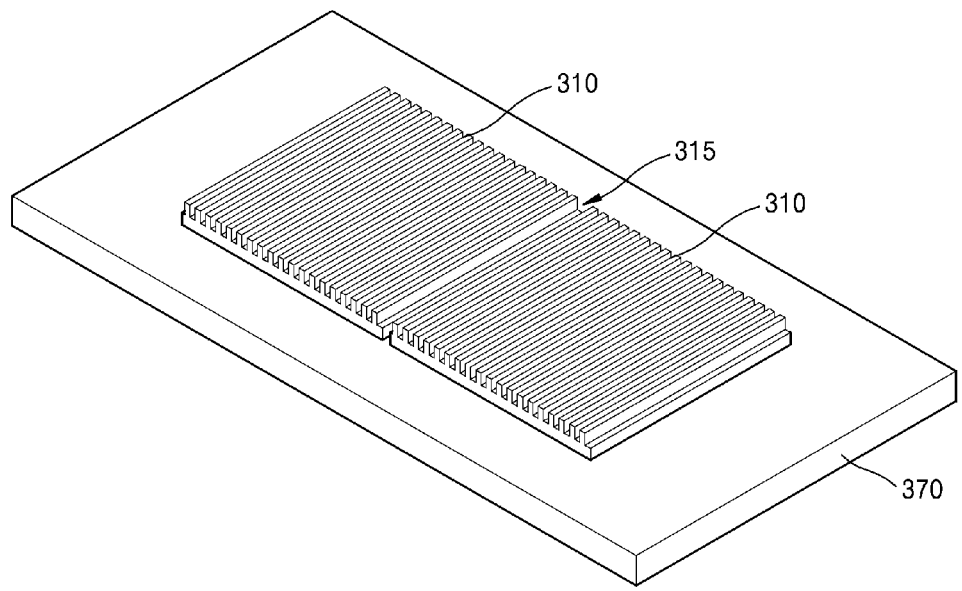

Next, referring to FIG. 10, the pattern structure units 310 that are arranged on the substrate 370 may be moved to be arranged substantially close to each other. In such an embodiment, where the cutting surfaces 313 of the pattern structure units 310 have a predetermined surface roughness, an empty space 315 may be formed between the cutting surfaces 313 when the cutting surfaces 313 are moved close to each other. The maximum interval between the cutting surfaces 313 of the pattern structure units 310 adjacent to each other may be less than about 10 μm.

Figure 11:
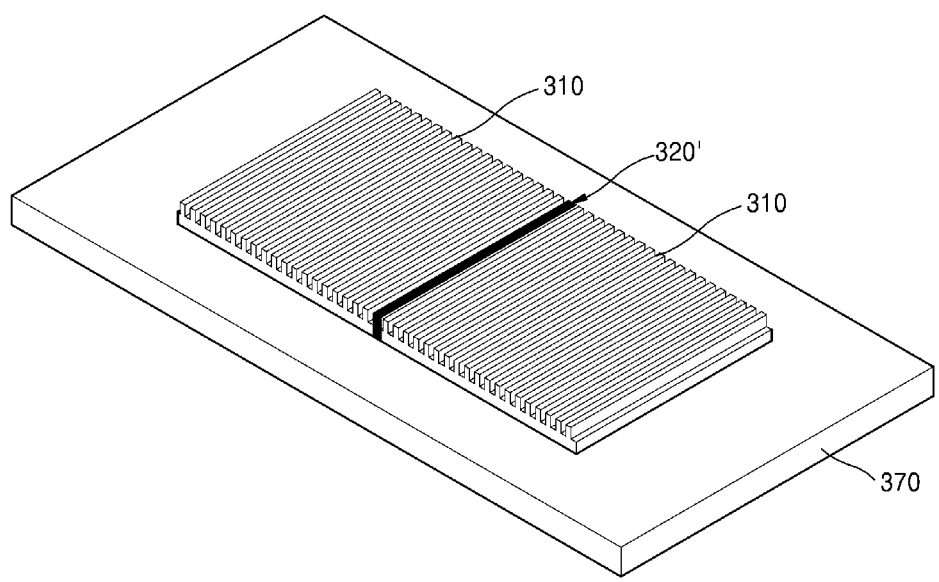

Referring to FIG. 11, a predetermined resin 320' may be inserted in the empty space 315 between the pattern structure units 310. In an exemplary embodiment, the resin 320' is inserted by using a capillary phenomenon in the empty space 315 between the cutting surfaces 313 of the pattern structure units 310 adjacent to each other. In such an embodiment, the resin 320' may have a viscosity that is, for example, less than about 1000 centipoises (cps) to be inserted in the empty space 315 between the pattern structure units 310 using a capillary action. However, such an embodiment is not limited thereto. In such an embodiment, resin having a relatively higher viscosity may be used as the interval between the pattern structure units 310 increases. As resin having a relatively lower viscosity may be used as the interval between the pattern structure units 310 decreases. In one exemplary embodiment, where the interval between the pattern structure units 310 is about hundreds of nanometers, resin having a viscosity equal to or less than about 100 cps may be used, but not being limited thereto. The resin 320' may fill the whole or a part of the empty space 315 between the pattern structure units 310 by a capillary phenomenon.

In an exemplary embodiment, a thermosetting resin or a photocurable resin may be used as the resin 320'. In such an embodiment, for example, the resin 320' may include an acrylate-based material. In an alternative exemplary embodiment, a thermo-shrinking resin or a photo-shrinking resin may be used as the resin 320'. In such an embodiment, for example, the resin 320' may include a polyurethane-based material.

Figure 12:
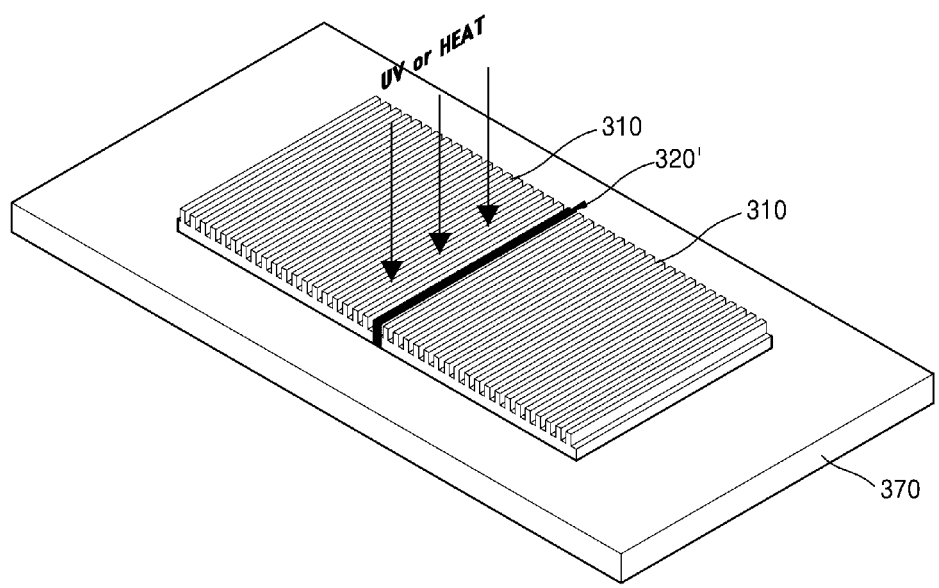

Referring to FIG. 12, heat or light, for example, an ultraviolet ("UV") light, may be applied to the resin 320' inserted between the pattern structure units 310. In one exemplary embodiment, For example, where a thermosetting resin or a photocurable resin is used as the resin 320', and heat or light is applied to the resin 320' inserted between the pattern structure units 310, the resin 320' is cured by a cross link reaction and thus the connection layer 320 of FIG. 13 connecting the pattern structure units 310 is formed. The connection layer 320 formed through the curing process of the resin 320' connects the pattern structure units 310 to each other.

Figure 13:
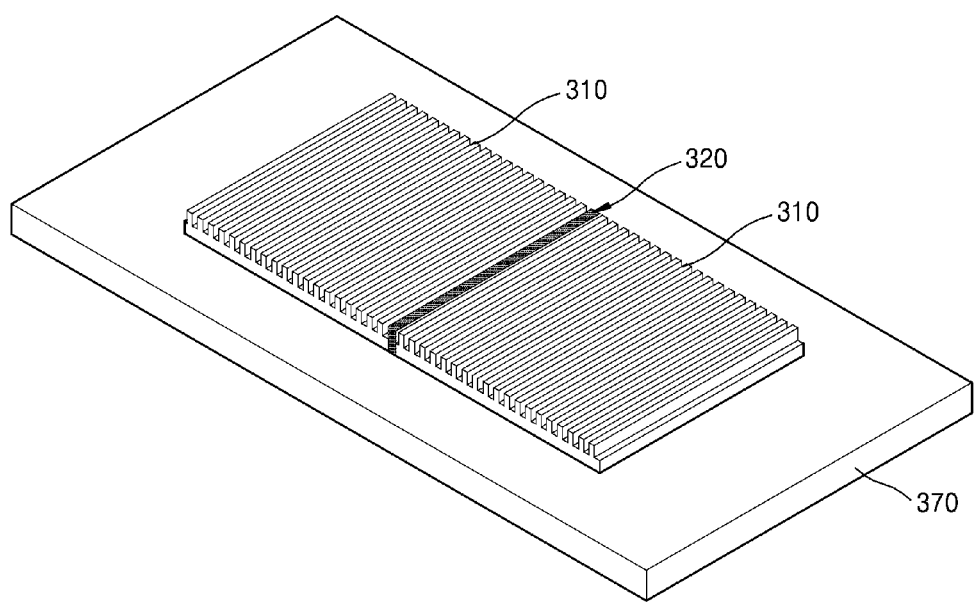

In one exemplary embodiment, for example, where the thermo-shrinking resin or photo-shrinking resin is used as the resin 320', and heat or light is applied to the resin 320' inserted between the pattern structure units 310, a solvent in the resin 320' evaporates and the resin 320' is compressed, thereby forming the connection layer 320 of FIG. 13 that connects the pattern structure units 310. The connection layer 320 formed as passing through the shrinkage process of the resin 320' may combine the pattern structure units 310 to each other.

FIG. 13 illustrates a state in which resin 320' inserted between the pattern structure units 310 is cured or shrunk to form the connection layer 320 that combines the pattern structure units 310. Referring to FIG. 13, the connection layer 320 may have a width corresponding to the interval between the bonding surfaces of the pattern structure units 310 adjacent to each other. In such an embodiment, the connection layer 320 may have a width of less than about 10 μm.

Figure 14:
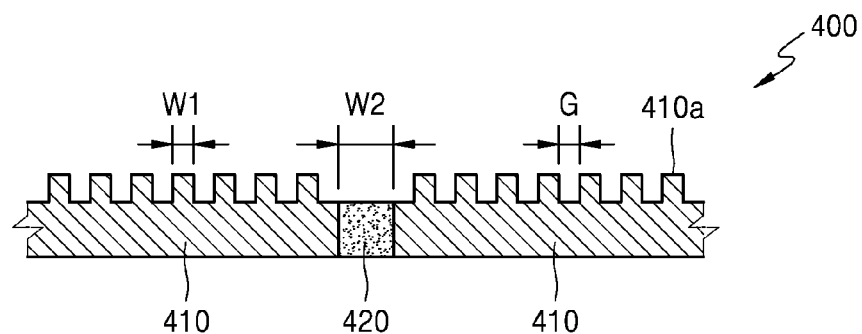
FIGS. 14 to 22 are cross-sectional views showing an exemplary embodiment of a method of manufacturing a metal wire grid polarizer, according to the invention.

FIGS. 14 to 22 are cross-sectional views showing an exemplary embodiment of a method of manufacturing a metal WGP according to the invention. FIG. 14 illustrates a method of manufacturing a metal WGP using an exemplary embodiment of the pattern structure described above as a master.

Referring to FIG. 14, in an exemplary embodiment, a master 400 is prepared. The master 400 is substantially the same as an exemplary embodiment of the pattern structure 100 described above with reference to FIG. 1. In such an embodiment, the master 400 may include a plurality of maser units 410 arranged substantially on the same plane and a connection layer 420 between the master units 410. In an exemplary embodiment, the master units 410 may include, for example, silicon (Si) or glass, but such an embodiment is not limited thereto. Each of the master units 410 includes microstructures 410a, each protruding from an upper surface of each of the master units 410 and having a width of less than about 1 μm. In an exemplary embodiment, the microstructures 410a may be arranged with a predetermined repeating pattern and substantially parallel to each other on the upper surface of each of the master units 410 with a width W1 of less than about 1 μm. In such an embodiment, an interval between the microstructures 410a may be less than about 1 μm and a height of each of the microstructures 410a may be less than about 1 μm, but such an embodiment is not limited thereto.

The master units 410 are arranged substantially on the same plane to be adjacent to each other, as shown in FIG. 14. The connection layer 420 is provided between the master units 410. The connection layer 420 combines the master units 410 to connect the master units 410 with each other. A width W2 of the connection layer 420 may be less than about 10 μm. The connection layer 420 may include a thermosetting resin or a photocurable resin. In such an embodiment, the connection layer 420 may include a thermo-shrinking resin or a photo-shrinking resin.

Figure 15:
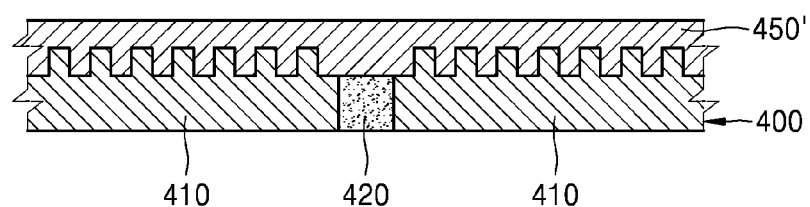
Figure 16:
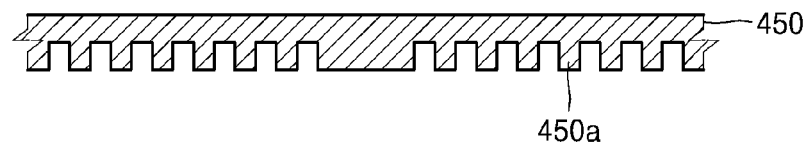

Referring to FIG. 15, in an exemplary embodiment, a mold material 450' is coated on the master 400 and then cured. Next, as illustrated in FIG. 16, the master 400 may be detached and thus a mold 450 for an imprint process that is described below is provided. Mold patterns 450a corresponding to the microstructures 410a of the master 410 are formed on the mold 450.

Figure 17:
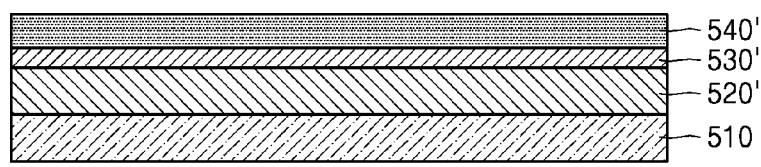

Referring to FIG. 17, in an exemplary embodiment, a metal layer 520', a hard mask 530', and a resin layer 540' are sequentially provided, e.g., formed, on a support substrate 510. In one exemplary embodiment, for example, a glass substrate may be used as the support substrate 510 and aluminum (Al) may be used as the metal layer 520'. However, such an embodiment is not limited thereto. In such an embodiment, the hard mask 530' may include a hard material and the resin layer 540' may include a flexible photocurable material.

Figure 18:
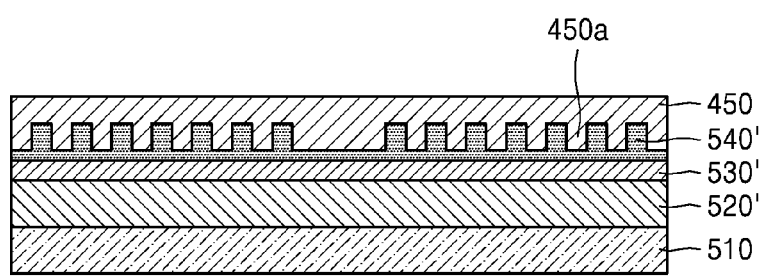
Figure 19:
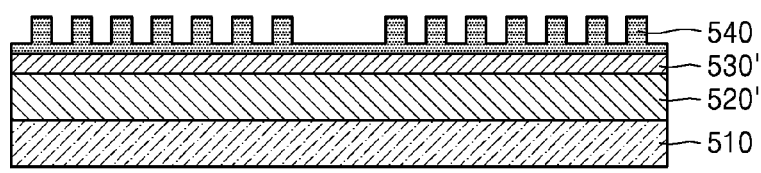

Referring to FIG. 18, in an exemplary embodiment, the mold 450 manufactured as illustrated in FIG. 16 is closely pressed to the resin layer 540' of FIG. 17. Accordingly, the resin layer 540' having flexibility fills a gap between the model patterns 450a formed on the mold 450. In such an embodiment, when light, for example, a UV light, is irradiated onto the resin layer 540' in a state in which the resin layer 540' fills the gap between the model patterns 450a formed on the mold 450, the resin layer 540' is cured. Next, when the mold 450 is detached, as illustrated in FIG. 19, a patterned resin layer 540 may be formed on the hard mask 530'.

Figure 20:
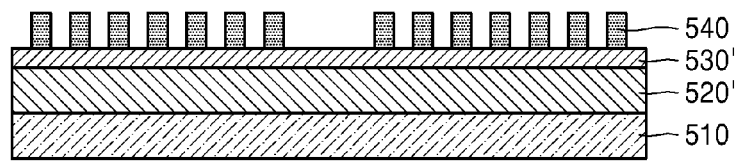
Figure 21:
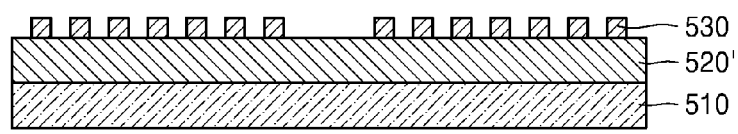
Figure 22:
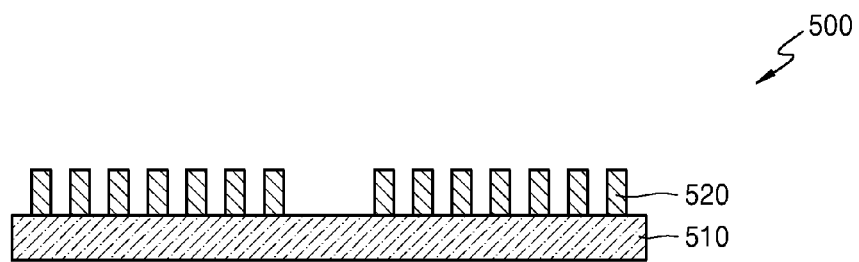

Referring to FIG. 20, in an exemplary embodiment, the resin material remaining on the hard mask 540' is removed by performing an etching process using the patterned resin layer 540 as a mask. In an exemplary embodiment, referring to FIG. 21, after patterning the hard mask 530' using the patterned resin layer 540 as a mask, the patterned resin layer 540 is removed. In an exemplary embodiment, referring to FIG. 22, after patterning the metal layer 520' using the patterned hard mask 530 as a mask, the patterned hard mask 530 is removed and thus a metal WGP 500 including the support substrate 510 and a plurality of metal wire patterns 520 provided on the support substrate 510 is provided.

Figure 23:
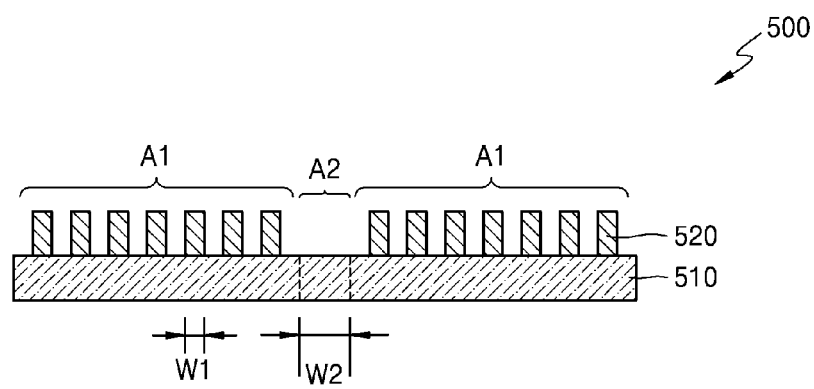
FIG. 23 is an enlarged cross-sectional view of an exemplary embodiment of the metal wire grid polarizer manufactured by a method described with reference to FIGS. 14 to 22.

FIG. 23 is an enlarged cross-sectional view of an exemplary embodiment of the metal WGP 500 manufactured by a method described with reference to FIGS. 14 to 22.

Referring to FIG. 23, the metal WGP 500 may include the support substrate 510 and the metal wire patterns 520 on the support substrate 510. In one exemplary embodiment, for example, the support substrate 510 may include glass and the metal wire patterns 520 may include aluminum (Al). However, such an embodiment is not limited thereto.

The metal WGP 500 may have substantially the same shape as that of the master 400 of FIG. 14. In an exemplary embodiment, the metal WGP 500 may include a plurality of pattern areas A1 including metal wire patterns 520 and a seam area A2 disposed between the pattern areas A1. The pattern areas A1 may correspond to the master units 410 of the master 400 of FIG. 14. Accordingly, the metal wire patterns 520 in the pattern areas A1 may have the shapes corresponding to the microstructures 410a of the master unit 410. Accordingly, each of the metal wire patterns 520 may have a width W1 of less than about 1 μm, an interval between the metal wire patterns 520 may be less than about 1 μm, and a height of each of the metal wire patterns 520 may be less than about 1 μm, but such an embodiment is not limited thereto. The seam area A2 may correspond to the connection layer 420 of the master 400 of FIG. 14. Accordingly, the seam area A2 may have a width W2 of less than about 10 μm.

Figure 24:
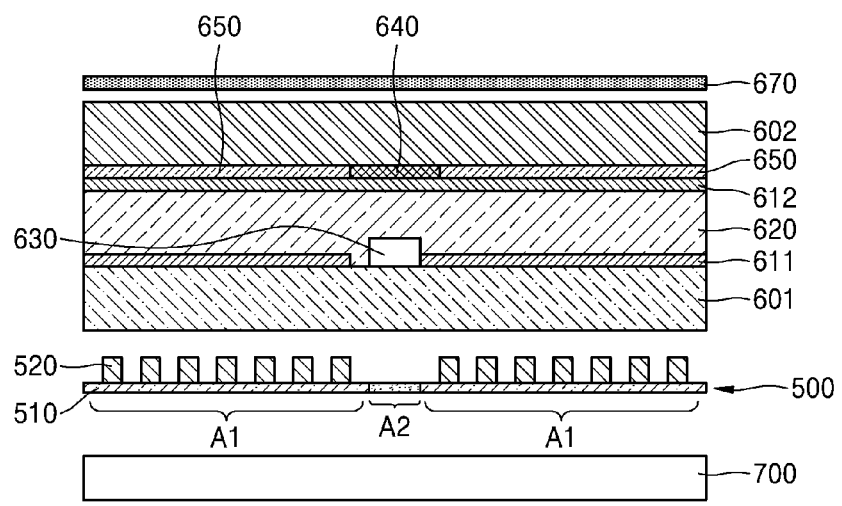
FIG. 24 illustrates an exemplary embodiment of a liquid crystal display device according to the invention.

FIG. 24 illustrates an exemplary embodiment of a LCD device according to the invention. FIG. 24 illustrates an exemplary embodiment of a LCD device including the metal WGP 500 of FIG. 23.

Referring to FIG. 24, an exemplary embodiment of the LCD includes first and second substrates 601 and 602, which are disposed opposite to each other, and a liquid crystal layer 620 disposed between the first and second substrates 601 and 602. The first and second substrates 601 and 602 may be lower and upper substrate, respectively. The first and second substrates 601 and 602 may include a transparent material such as glass. In such an embodiment, the LCD may further include a backlight unit 700 for emitting light of a predetermined color, for example, a white light, toward the liquid crystal layer 620, and disposed under the first substrate 601.

In such an embodiment, the LCD may further include the metal WGP 500 disposed on the first substrate 601. In one exemplary embodiment, for example, the metal WGP 500 may be disposed between the back light unit 700 and the first substrate 601. However, such an embodiment is not limited thereto and the metal WGP 500 may be disposed above an upper surface of the first substrate 601.

The metal WGP 500 may include the support substrate 510 and the metal wire patterns 520 on the support substrate 510. In such an embodiment, as described above, the metal WGP 500 includes the pattern areas A1 including the metal wire patterns 520 and the seam area A2 disposed between the pattern areas A1. Each of the metal wire patterns 520 may have a width of less than about 1 μm. The seam area A2 may have a width of less than about 10 μm.

In such an embodiment, the LCD may further include a plurality of first electrodes 611 and a plurality of thin film transistors ("TFT"s) 630 for driving the first electrodes 611, which are disposed on the first substrate 601. The first electrodes 611 may be pixel electrodes. In such an embodiment, the LCD may further include a second electrode 612 disposed on the second substrate 602. The second electrode 612 may be a common electrode.

In such an embodiment, the LCD may further include a plurality of color filters 650 disposed on the second substrate 602 to correspond to the first electrode 611. Each of the color filters 650 may have a predetermined color, for example, red, green or blue. In such an embodiment, the LCD may further include a black matrix 640 disposed between the color filters 650. The black matrix 640 may effectively prevent cross talk between the pixels and improve contrast. In such an embodiment, the LCD may further include a polarizer 670 disposed on the second substrate 602. In such an embodiment, the polarizer 670 may be provided, for example, on an upper surface of the second substrate 602, but such an embodiment is not limited thereto. In an exemplary embodiment, a PVA polarizer, that is, an absorptive polarizer, for example, may be used as the polarizer 670, but such an embodiment is not limited thereto.

In an exemplary embodiment of the LCD device, the seam area A2 of the metal WGP 500 is provided at a position corresponding to the black matrix 640. In such an embodiment, the seam area A2 of the metal WGP 500 is provided under the black matrix 640. The width of the seam area A2 may be smaller than the width of the black matrix 640. As such, when the seam area A2 having a width that is less than that of the black matrix 640 is located under the black matrix 640, the seam area A2 of the metal WGP 500 is covered by the black matrix 640 and thus a seamless image may be embodied in a large size. In such an embodiment, where the LCD is a large-sized LCD device, for example, larger than 55 inches, the LCD include the metal WGP 500 having the seam area A2 having a width of less than about 10 µm as described above and the seam area A2 of the metal WGP 500 is located under the black matrix 640, such that a seamless image may be effectively embodied in such a large-size LCD.

In an exemplary embodiment described above, the large-sized pattern structure is applied to the metal WGP with the microstructures arranged with a predetermined repeating pattern and substantially parallel to each other. In such an embodiment, the microstructures may be repeatedly arranged in the large-sized pattern structure, but not being limited thereto. In an alternative exemplary embodiment, the large-sized pattern structure may be applied to various applied fields other than the metal WGP.

Figure 25:
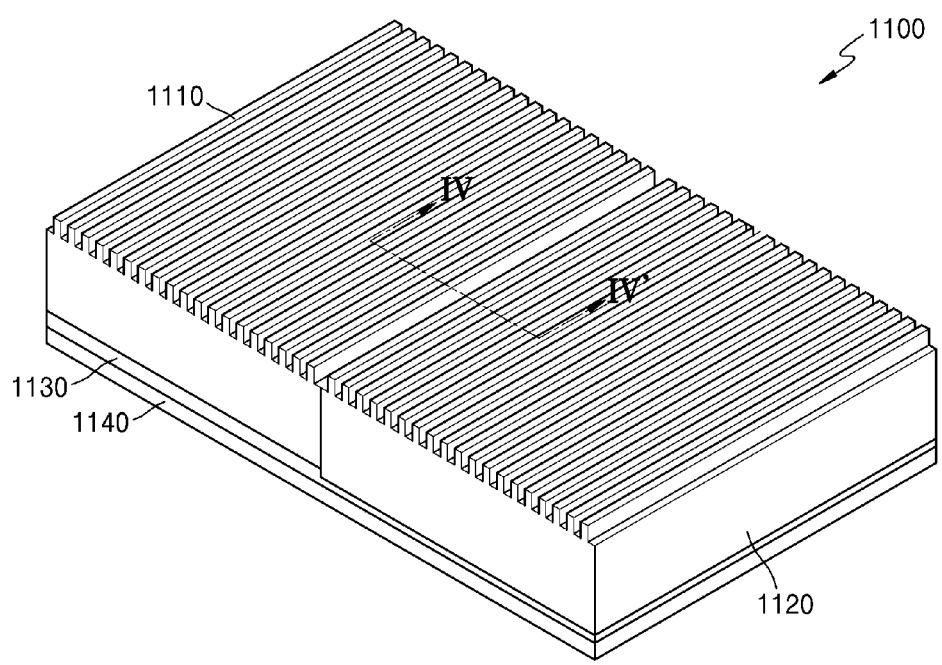
FIG. 25 is a perspective view illustrating an exemplary embodiment of a pattern structure according to the invention.
Figure 26:
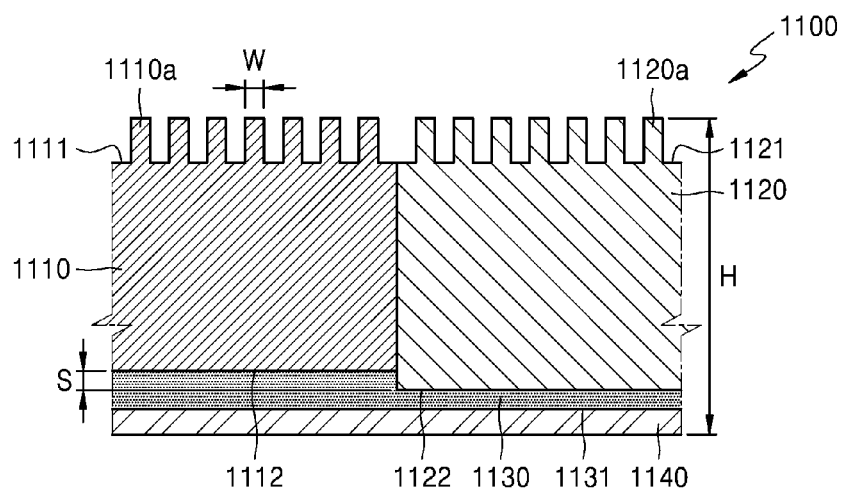
FIG. 26 is a cross-sectional view taken along line IV-IV' of FIG. 25.

FIG. 25 is a perspective view illustrating an exemplary embodiment of a pattern structure 1100 according to the invention. FIG. 26 is a cross-sectional view taken along line IV-IV' of FIG. 25.

Referring to FIGS. 25 and 26, an exemplary embodiment of the pattern structure 1100 may include the first and second pattern structure units 1110 and 1120 arranged substantially on the same plane, a flattening layer 1130 disposed on the first and second pattern structure units 1110 and 1120, and a substrate 1140 disposed on the flattening layer 1130. In such an embodiment, a surface of the first pattern structure unit 1110 and a surface of the second pattern structure unit 1120 may be disposed in the same plane.

The first pattern structure unit 1110 may include a first surface 1111 (e.g., an upper surface in FIG. 25) and a second surface 1112 (e.g., a lower surface in FIG. 25), which are opposite to each other. A plurality of first microstructures 1110a protrudes from the first surface 1111 of the first pattern structure unit 1110. A width W of each of the first microstructures 1110a may be less than, for example, about 1 µm. In an exemplary embodiment, the first microstructures 1110a may be arranged with a predetermined repeating pattern and substantially parallel to each other, e.g., with a width W of less than about 1 µm on the first surface 1111 of the first pattern structure unit 1110. In such an embodiment, the interval between the microstructures 1110a may be less than about 1 µm, and a height of each of the first microstructures 1110a may be less than about 1 µm. However, such an embodiment is not limited thereto, and the first microstructures 1110a may be modified in various shapes other than the above-described shape.

The first pattern structure unit 1110 may include or be formed of, for example, silicon (Si) or glass. In an exemplary embodiment, the first pattern structure unit 1110 may be manufactured by forming the first microstructures 1110a on a silicon wafer or a glass wafer using a patterning process. In an exemplary embodiment, the first pattern structure unit 1110 may include or be formed of resin, for example, polyethylene phthalate ("PET"), N,N-dimethylacrylamide ("PDMA"), or polycarbonate ("PC"). In such an embodiment, the first pattern structure unit 1110 may be manufactured by forming the first microstructures 1110a by an imprint process. The first pattern structure unit 1110 may be modified to include various materials other than the above-described material.

The second pattern structure unit 1120 may include a first surface 1121 (e.g., an upper surface in FIG. 25) and a second surface 1122 (e.g., a lower surface in FIG. 25), which are opposite to each other. A plurality of second microstructures 1120a protrudes from the first surface 1121 of the second pattern structure unit 1120. In one exemplary embodiment, for example, A width W of each of the second microstructures 1120a may be less than about 1 µm, as in the first microstructures 1110a, but such an embodiment is not limited thereto. The second pattern structure unit 1120 may include or be formed of, for example, silicon (Si), glass, or resin.

The first and second pattern structure units 1110 and 1120 are arranged substantially on the same plane adjacent to each other. In an exemplary embodiment, the first microstructures 1110a on the first surface 1111 of the first pattern structure unit 1110 and the second microstructures 1120a on the first surface 1121 of the second pattern structure unit 1120 may have the same level or height H from a bottom surface of a substrate 1140 disposed therebelow. Herein, the level of height H of the microstructure is defined as a distance between a top surface of the microstructure and a bottom surface of the substrate 1140. In such an embodiment, as illustrated in FIG. 2, as the upper surfaces of the first microstructures 1110a and the upper surfaces of the second microstructures 1120a are located substantially at the same level or height H, the upper surfaces may be flat with respect to each other. Accordingly, no vertical step difference may be generated between the first microstructures 1110a and the second microstructures 1120a.

A vertical step difference S may exist between the second surface 1112 of the first pattern structure unit 1110 and the second surface 1122 of the second pattern structure unit 1120. The vertical step difference S may be generated due to a difference in the thickness between the first pattern structure unit 1110 and the second pattern structure unit 1120. In one exemplary embodiment, for example, when the pattern structure units are manufactured using wafers each having a thickness in a range of about 400 µm to about 800 µm, a predetermined thickness deviation in a range of about 20 µm to about 30 µm may exist between the wafers. Accordingly, a thickness deviation may exist between the pattern structure units manufactured on the wafers such that a vertical step difference may be generated due to a difference in the thickness between the pattern structure units when the pattern structure units are arranged adjacent to each other.

In an exemplary embodiment, the flattening layer 1130 may be provided to cover the second surface 1112 of the first pattern structure unit 1110 and the second surface 1122 of the second pattern structure unit 1120 having a vertical step difference. The flattening layer 1130 connects the first pattern structure unit 1110 and the second pattern structure unit 1120 and, as described below, effectively prevents a vertical step difference between the first microstructures 1110a and the second microstructures 1120a from being generated. In an exemplary embodiment, the flattening layer 1130 may include, for example, a thermosetting resin or a photocurable resin. In one exemplary embodiment, the thermosetting resin or photocurable resin may include, for example, an acrylate-based material, but such an embodiment is not limited thereto. The substrate 1140 may be further provided on a lower surface 1131 of the flattening layer 1130. The substrate 1140 may be flat and may include a relatively hard material. Accordingly, the lower surface 1131 of the flattening layer 1130 contacting the substrate 1140 may be substantially flat.

In an exemplary embodiment, as described above, the two pattern structure units 1110 and 1120 are arranged on the same plane in one dimension, but not being limited thereto. In an alternative exemplary embodiment, three or more pattern structure units may be arranged substantially on the same plane substantially in a matrix form. In such an embodiment, the microstructures of the pattern structure units are all disposed substantially at the same level or height, and a vertical step difference due to a difference in the thickness between the pattern structure units may exist between at least two of the pattern structure units.

As described above, in an exemplary embodiment of the pattern structure 1100 according to the invention, a vertical step difference S due to a difference in the thickness between the first pattern structure unit 1110 and the second pattern structure unit 1120 may be generated. However, in such an embodiment, the flattening layer 1130 is provided on the first and second pattern structure units 1110 and 1120, such that the first microstructures 1110a of the first pattern structure unit 1110 and the second microstructures 1120a of the second pattern structure unit 1120 may be located substantially at the same level or height H. In general, when a difference in the height exists between the pattern structures, uniformity of the entire pattern is degraded and thus large-sized patterning may not be effectively preformed. In an exemplary embodiment of the pattern structure 1100, both the first and second microstructures 1110a and 1120a are disposed substantially at the same level or height H by using the flattening layer 1130 and thus a uniform pattern may be embodied in a large size.

The pattern structure 1100 may be applied to, for example, a master for manufacturing a stamp or a stamp for imprint. In an exemplary embodiment, the pattern structure 1100 may be directly used as a master for manufacturing a stamp. In an exemplary embodiment, a stamp for imprint may be manufactured using the pattern structure 1100 as a master. In such an embodiment, a large-sized stamp may be effectively manufactured as a flexible film, and a roll type stamp may be embodied.

Recently, as the size of an LCD panel gradually increases, there is a demand to manufacture a metal WGP applied to the LCD panel to be in a large size without defects. Accordingly, a master or stamp for manufacturing a WGP may be manufactured in a large size. In this case, a mask or stamp having no defect and uniform physical properties across the entire area may be embodied in a large size using an exemplary embodiment of the pattern structure described above. The pattern structure 1100 may be applied to various fields other than the master or stamp.

Figure 27:
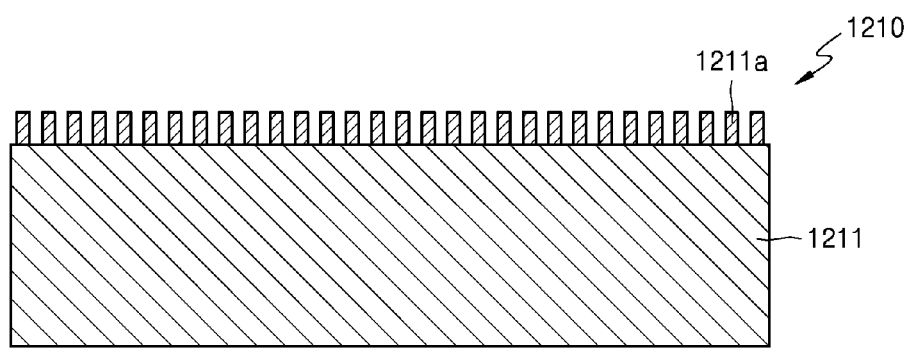
FIG. 27 illustrates an exemplary embodiment of a pattern structure unit of a pattern structure, according to the invention.

FIG. 27 illustrates an exemplary embodiment of a pattern structure unit 1210 of a pattern structure, according to the invention.

Referring to FIG. 27, an exemplary embodiment of the pattern structure unit 1210 may include a substrate 1211 and a plurality of microstructures 1211a disposed on the substrate 1211. In an exemplary embodiment, each of the pattern structure units 1110 and 1120 may be integrally formed as a single unitary and indivisible unit, e.g., integrally manufactured using a same material, but not being limited thereto. In an alternative exemplary embodiment, as shown in FIG. 27, the substrate 1211 and the microstructures 1211a may include different materials from each other. In one exemplary embodiment, for example, the substrate 1211 may include silicon and the microstructures 1211a may include a silicon oxide. In such an embodiment, the pattern structure unit 1210 may be manufactured by forming the microstructures 1211a after a silicon oxide layer is provided on the substrate 1211 formed of silicon and then patterned. The substrate 1211 and the microstructures 1211a may be variously modified to include a material other than the above-described material.

Figure 28:
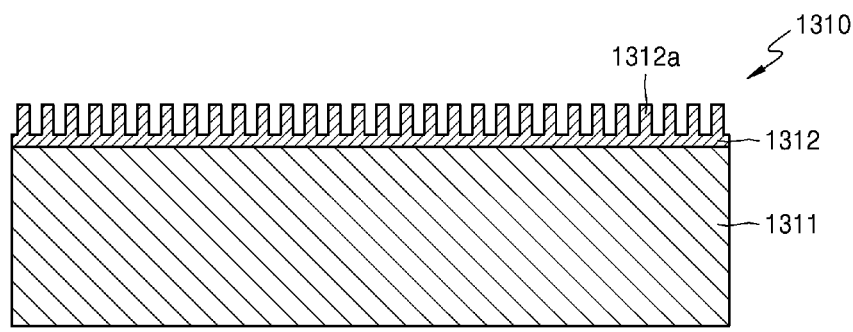
FIG. 28 illustrates an alternative exemplary embodiment of a pattern structure unit of a pattern structure, according to the invention.

FIG. 28 illustrates an alternative exemplary embodiment of a pattern structure unit 1310 of a pattern structure, according to the invention.

Referring to FIG. 28, an exemplary embodiment of the pattern structure unit 1310 may include a substrate 1311 and a pattern layer 1312 disposed on the substrate 1311 and including a plurality of microstructures 1312a. The microstructures 1312a may protrude from an upper surface of the pattern layer 1312. In one exemplary embodiment, for example, the substrate 1311 may include silicon or glass and the pattern layer 1312 may include resin such as PET, PDMA, or PC, but such an embodiment is not limited thereto. The pattern structure unit 1310 may be manufactured by coating resin on the substrate 1311 and then forming the microstructures 1312a in an imprint process.

Hereinafter, an exemplary embodiment of a method of manufacturing the above-described pattern structure will be described. FIGS. 29 to 36 are cross-sectional views showing an exemplary embodiment of a method of manufacturing a pattern structure according to the invention.

Figure 29:
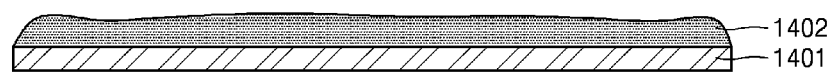
FIGS. 29 to 36 are cross-sectional views showing an exemplary embodiment of a method of manufacturing a pattern structure according to the invention.

Referring to FIG. 29, in an exemplary embodiment, a first substrate 1401 is prepared and then a flattening resin, e.g., a first flattening resin 1401, on the first substrate 1401. The first substrate 1401 may include a flat upper surface, and the first flattening resin 1402 may be coated on the flat upper surface of the first substrate 1401. The first flattening resin 1402 may have a predetermined viscosity to flow and be deformed by an external pressure. The first flattening resin 1402 may include a material that is less contracted and is imprintable. Also, the first flattening resin 1402, as described below, may further include a releasing agent to be easily separate from the first and second microstructures 1410a and 1420a of FIG. 35. The surfaces of the first and second microstructures 1410a and 1420a or a surface of the first flattening resin 1402 may be release-processed. In an exemplary embodiment, the first flattening resin 1402 may include a thermosetting resin or a photocurable resin. In one exemplary embodiment, for example, the thermosetting resin or photocurable resin may include, for example, an acrylate-based material, but such an embodiment is not limited thereto, and the thermosetting resin or photocurable resin may include various other materials.

Figure 30:
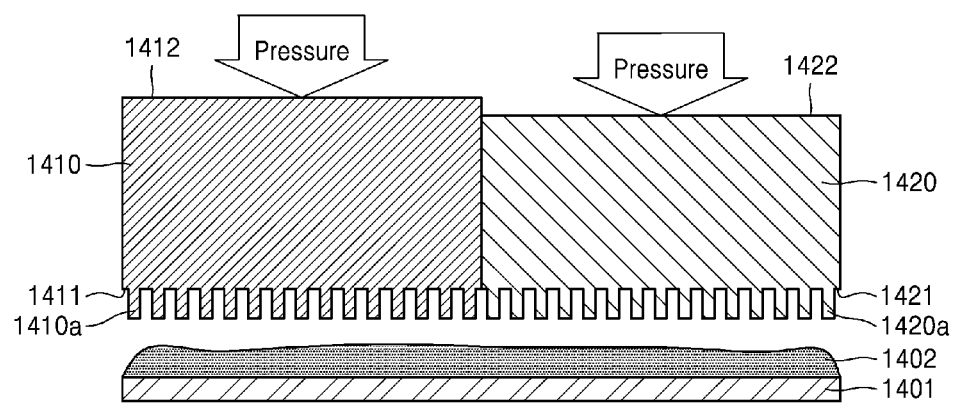

Referring to FIG. 30, in an exemplary embodiment, the first and second pattern structure units 1410 and 1420 are arranged on the first substrate 1401 that is coated with the first flattening resin 1402. The first and second pattern structure units 1410 and 1420 may be arranged to closely contact each other to minimize the interval between the first and second pattern structure units 1410 and 1420. The first pattern structure unit 1410 may include a first surface 1411 (e.g., a lower surface in FIG. 30) and a second surface 1412 (e.g., an upper surface of FIG. 30) which are opposite surfaces. The first microstructures 1410a protrudes on the first surface 1411 of the first pattern structure unit 1410. The second pattern structure unit 1420 may include a first surface 1421 (e.g., a lower surface in FIG. 30) and a second surface 1422 (e.g., an upper surface of FIG. 30) which are opposite surfaces. The second microstructures 1420a protrudes on the first surface 1421 of the second pattern structure unit 1420. The first and second pattern structure units 1410 and 1420 may include, for example, silicon (Si), glass, PET, PDMA, or PC, but such an embodiment is not limited thereto. FIG. 30 shows an exemplary embodiment in which the first and second pattern structure units 1410 and 1420 are integrally manufactured, but not being limited thereto. In an alternative exemplary embodiment, the pattern structure unit 1210 of FIG. 27 or the pattern structure unit 1310 or FIG. 28 may be used.

The first and second pattern structure units 1410 and 1420 may be arranged such that the first and second microstructures 1410*a* and 1420*a* face the upper surface of the first substrate 1401. The first pattern structure unit 1410 and the second pattern structure unit 1420 may have different thicknesses from each other. In such an embodiment, while the first and second pattern structure units 1410 and 1420 are arranged on the first substrate 1401 that is flat, the first and second pattern structure units 1410 and 1420 is pressed by a predetermine pressure to closely or directly contact the first flattening resin 1402.

Figure 31:
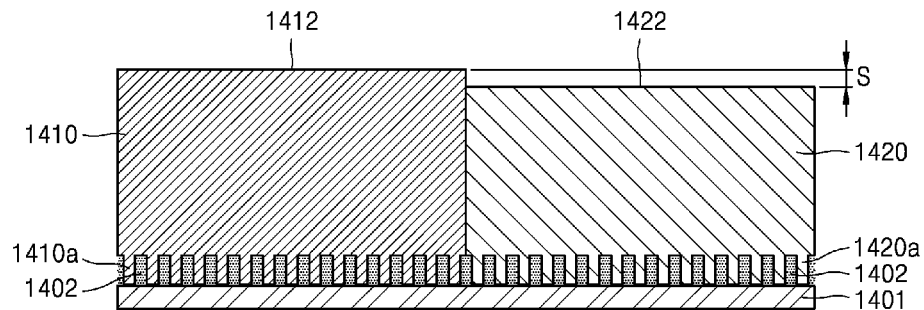

Referring to FIG. 31, in an exemplary embodiment, when the first and second pattern structure units 1410 and 1420 is pressed against the first flattening resin 1402 by a predetermined pressure to closely or directly contact the first flattening resin 1402, the first flattening resin 1402 coated on the first substrate 1401 flows to fill gaps between the first microstructures 1410*a* and gaps between the second microstructures 1420*a*. The first flattening resin 1402 filling the gaps may fix the first and second pattern structure units 1410 and 1420. When the pressure applied to the first and second pattern structure units 1410 and 1420 is adjusted, the first microstructures 1410*a* and the second microstructures 1420*a* may be provided substantially parallel to the flat upper surface of the first substrate 1402. Accordingly, the lower surface of the first microstructures 1410*a* and the lower surface of the second microstructures 1420*a* may be substantially flat corresponding to the upper surface of the first substrate 1401. In such an embodiment, as the lower surface of the first microstructures 1410*a* and the lower surface of the second microstructures 1420*a* are located substantially at the same height or level, a vertical step difference may not be generated between the first microstructures 1410*a* and the second microstructures 1420*a*. A predetermined vertical step difference S may be generated between the second surface 1412 of the first pattern structure unit 1410 and the second surface 1422 of the second pattern structure unit 1420 due to a difference in the thickness between the first and second pattern structure units 1410 and 1420.

Figure 32:
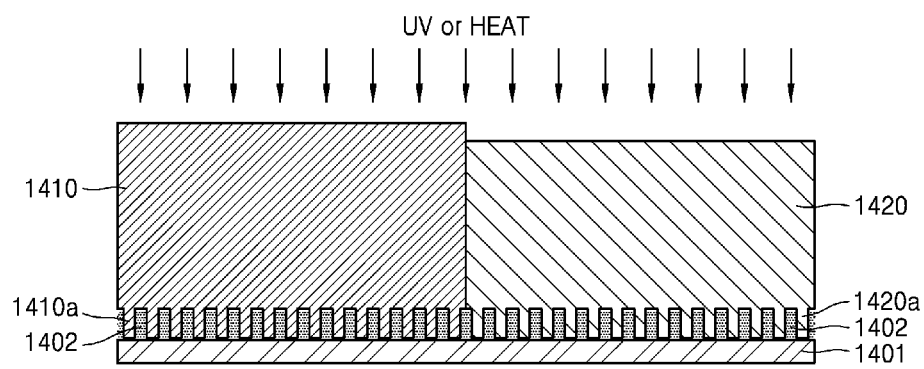

Referring to FIG. 32, in an exemplary embodiment, the first flattening resin 1402 filling a gap between the first and second microstructures 1410*a* and 1420*a* is cured. In one exemplary embodiment, for example, when the first flattening resin 1402 includes photocurable resin, and light, for example, a UV light, is irradiated onto the first flattening resin 1402, the first flattening resin 1402 may be cured. In an exemplary embodiment, where the first flattening resin 1402 includes thermosetting resin and heat is applied to the first flattening resin 1402, the first flattening resin 1402 may be cured. In such an embodiment, as the first flattening resin 1402 is cured, the first and second pattern structure units 1410 and 1420 may be more firmly fixed on the first substrate 1401. In such an embodiment, the above-described process of curing the first flattening resin 1402 may be omitted. In an exemplary embodiment, the process of coating the first flattening resin 1402 on the first substrate 1401 and curing the first flattening resin 1402, which are described above, may be omitted. In such an embodiment, only the first and second pattern structure units 1410 and 1420 may be arranged on the first substrate 1401 that is flat.

Figure 33:
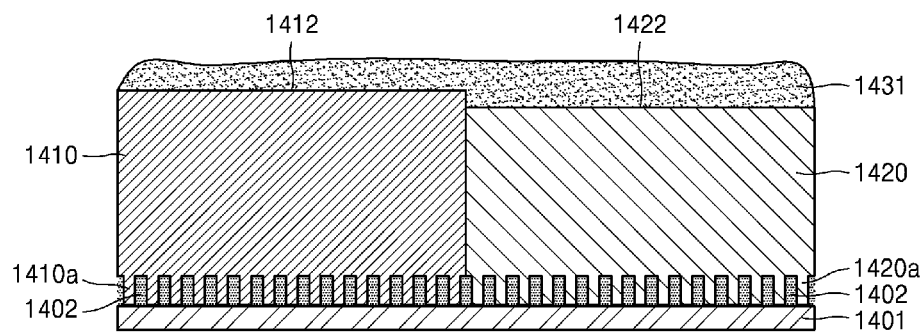

Referring to FIG. 33, in an exemplary embodiment, a flattening resin, e.g., a second flattening resin 1431, is coated on the second surface 1412 of the first pattern structure unit 1410 and the second surface 1422 of the second pattern structure unit 1420. As described above, a vertical step difference S may exist between the second surface 1412 of the first pattern structure unit 1410 and the second surface 1422 of the second pattern structure unit 1420. The second flattening resin 1431 may be coated to a predetermined thickness to cover the second surface 1412 of the first pattern structure unit 1410 and the second surface 1422 of the second pattern structure unit 1420 having the vertical step difference S.

The second flattening resin 1431 may have a predetermine viscosity to flow and be deformable by an external pressure. The second flattening resin 1431 may include a material exhibiting high adhesion with the first and second pattern structure units 1410 and 1420 or a second substrate 1440 of FIG. 34. In an exemplary embodiment, an adhesive layer may be additionally provided between the second flattening resin 1431 and the first and second pattern structure units 1410 and 1420, or between the second flattening resin 1431 and the second substrate 1440. The second flattening resin 1431 may include a thermosetting resin or a photocurable resin. In one exemplary embodiment, for example, the thermosetting resin or photocurable resin may include, e.g., an acrylate-based material, but such an embodiment is not limited thereto, and the thermosetting resin or photocurable resin may include various other materials.

Figure 34:
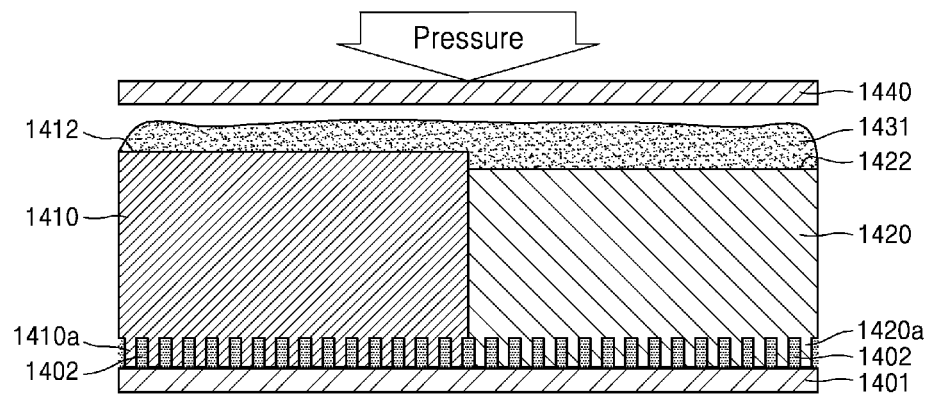
Figure 35:
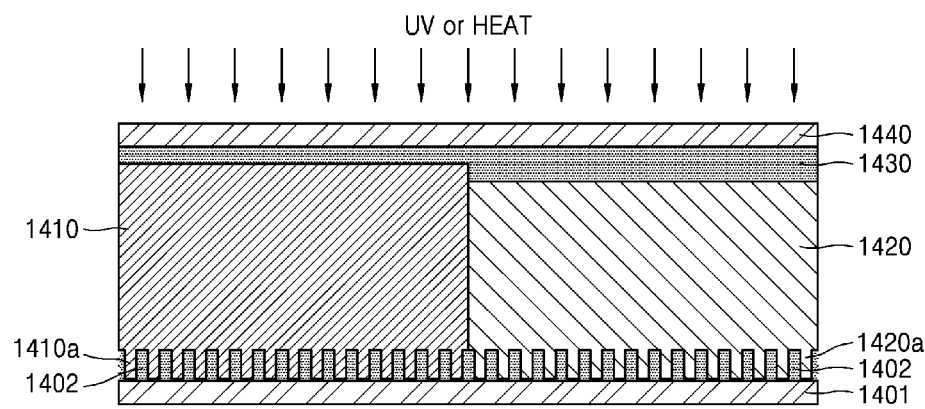

Referring to FIG. 34, in an exemplary embodiment, the second substrate 1440 that is flat is provided above the second flattening resin 1431. In such an embodiment, the second substrate 1440 is pressed by a predetermined pressure to closely or directly contact the second flattening resin 1431. Accordingly, in an exemplary embodiment, as illustrated in FIG. 35, a flattening layer 1430 that connects the first and second pattern structure units 1410 and 1420 may be formed between the first and second pattern structure units 1410 and 1420 and the second substrate 1440. In such an embodiment, when the vertical step difference S may exist between the second surface 1412 of the first pattern structure unit 1410 and the second surface 1422 of the second pattern structure unit 1420 contacting the flattening layer 1430, the upper surface of the flattening layer 1430 contacting the second substrate 1440 is flattened due to the second substrate 1440 and thus no vertical step difference is generated on the upper surface of the flattening layer 1430. The flattening layer 1430 having adhesion properties may connect the second substrate 1440 and the first and second pattern structure units 1410 and 1420.

Next, the second flattening resin 1431 is cured. In one exemplary embodiment, for example, when the second flattening resin 1431 includes photocurable resin and light, for example, a UV light, is irradiated onto the second flattening resin 1431, the second flattening resin 1431 is cured to form the flattening layer 1430. In an exemplary embodiment, where the second flattening resin 1431 includes thermosetting resin and heat is applied to the second flattening resin 1431, the second flattening resin 1431 is cured to form the flattening layer 1430. As such, in an exemplary embodiment, the flattening layer 1430 is formed, such that the first pattern structure unit 1410 and the second pattern structure unit 1420 may be more firmly connected to each other. In such an embodiment, the second substrate 1440 and the first and second pattern structure units 1410 and 1420 may be firmly connected to each other.

Figure 36:
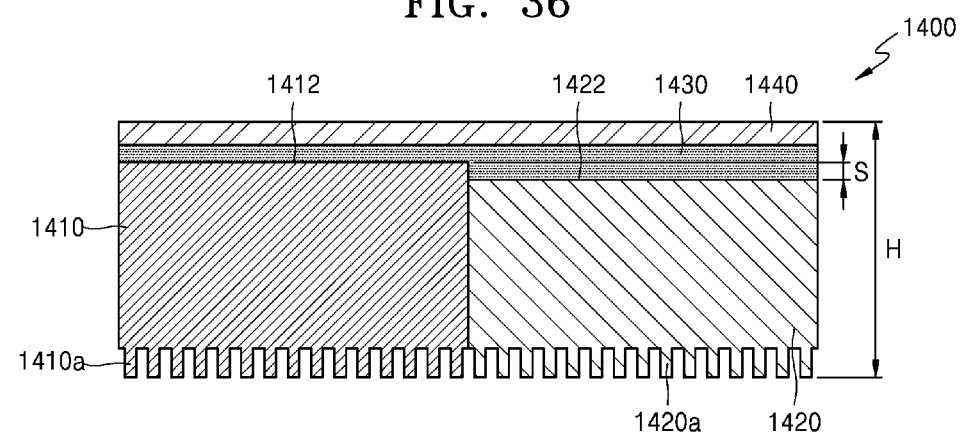

Referring to FIG. 36, in an exemplary embodiment, as the first flattening resin 1402 that is formed and cured on the first substrate 1401 is detached from the first and second pattern structure units 1410 and 1420, a pattern structure 1400 may be formed. As described above, the first flattening resin 1402 may include a release agent to facilitate separation of the first flattening resin 1402. In such an embodiment, the surfaces of the first and second microstructures 1410*a* and 1420*a* or the surface of the first flattening resin 1402 may be release-processed.

According to exemplary embodiments of the invention, as described herein, the flatting layer is provided on the pattern structure units having a vertical step difference, such that the microstructures on the pattern structure units are located substantially at the same height or level. Accordingly, a pattern structure that embodies a uniform pattern in a large size may be manufactured.

It should be understood that the exemplary embodiments described herein should be considered in a descriptive sense only and not for purposes of limitation. Descriptions of features or aspects within each embodiment should typically be considered as available for other similar features or aspects in other embodiments.

While one or more embodiments have been described with reference to the figures, it will be understood by those of ordinary skill in the art that various changes in form and details may be made therein without departing from the spirit and scope of the invention as defined by the following claims.

What is claimed is:

1. A pattern structure comprising:
   a plurality of pattern structure units arranged substantially on a same plane, wherein each of the plurality of pattern structure units has a first surface and a second surface, which are opposite to each other, and a microstructure is defined on the first surface of each of the plurality of pattern structure units; and
   a flattening layer disposed on the second surface of each of the plurality of pattern structure units, wherein the flattening layer connects the plurality of pattern structure units with each other,
   wherein each of the second surfaces of the plurality of pattern structure units has a flat shape and a vertical step difference exists between second surfaces of the plurality of pattern structure units,
   wherein microstructures of the plurality of pattern structure units are located substantially at a same height.

2. The pattern structure of claim 1, further comprising:
   a substrate disposed on the flattening layer.

3. The pattern structure of claim 2, wherein a surface of the flattening layer contacting the substrate is substantially flat.

4. The pattern structure of claim 1, wherein the flattening layer comprises a thermosetting resin or a photocurable resin.

5. The pattern structure of claim 1, wherein each of microstructures of the plurality of pattern structure units has a width of less than about 1 micrometer.

6. The pattern structure of claim 5, wherein the microstructures are arranged with a predetermined repeating pattern and substantially parallel to each other.

7. The pattern structure of claim 1, wherein the plurality of pattern structure units are arranged substantially in a matrix form.

8. The pattern structure of claim 1, wherein the pattern structure is configured to function as a master for manufacturing a stamp or a stamp for imprint.

\* \* \* \* \*